United States Patent
Wang et al.

(10) Patent No.: US 7,236,018 B1
(45) Date of Patent: Jun. 26, 2007

(54) PROGRAMMABLE LOW-VOLTAGE DIFFERENTIAL SIGNALING OUTPUT DRIVER

(75) Inventors: Bonnie Wang, Cupertino, CA (US); Chiakang Sung, Milpitas, CA (US); Khai Nguyen, San Jose, CA (US)

(73) Assignee: Altera Corporation, San Jose, CA (US)

( * ) Notice: Subject to any disclaimer, the term of this patent is extended or adjusted under 35 U.S.C. 154(b) by 112 days.

(21) Appl. No.: 10/937,518

(22) Filed: Sep. 8, 2004

(51) Int. Cl.
*H03B 1/00* (2006.01)

(52) U.S. Cl. .......................... 327/108; 327/112; 326/83

(58) Field of Classification Search ................ 327/112, 327/148, 157, 408, 423, 588, 391, 170, 108; 326/26, 27, 30, 83, 86
See application file for complete search history.

(56) References Cited

U.S. PATENT DOCUMENTS

| | | | | |
|---|---|---|---|---|
| 5,939,931 | A * | 8/1999 | Noro | 327/424 |
| 5,945,855 | A * | 8/1999 | Momtaz | 327/157 |
| 5,977,796 | A * | 11/1999 | Gabara | 326/30 |
| 6,040,712 | A | 3/2000 | Mejia | |
| 6,278,332 | B1 * | 8/2001 | Nelson et al. | 331/17 |
| 6,535,051 | B2 * | 3/2003 | Kim | 327/536 |
| 6,603,348 | B1 * | 8/2003 | Preuss et al. | 327/563 |
| 6,650,140 | B2 | 11/2003 | Lee et al. | |
| 6,943,588 | B1 * | 9/2005 | Luo et al. | 326/30 |
| 6,952,126 | B2 * | 10/2005 | Byun et al. | 327/157 |
| 6,977,534 | B2 * | 12/2005 | Radelinow | 327/112 |
| 2003/0042949 | A1 * | 3/2003 | Si | 327/157 |
| 2003/0085736 | A1 * | 5/2003 | Tinsley et al. | 326/81 |
| 2005/0162200 | A1 * | 7/2005 | Haerle | 327/157 |
| 2005/0253634 | A1 * | 11/2005 | Wu | 327/157 |
| 2006/0006912 | A1 * | 1/2006 | Leonowich et al. | 327/112 |

\* cited by examiner

*Primary Examiner*—Long Nguyen
(74) *Attorney, Agent, or Firm*—Fish & Neave IP Group of Ropes & Gray LLP; Jeffrey H. Ingerman

(57) ABSTRACT

The present invention relates to a programmable low-voltage differential signaling (LVDS) output driver. The programmable LVDS output driver may include circuitry for tri-stating the output to allow several programmable LVDS output drivers to be coupled to a single receiver. The programmable LVDS output driver may also include programmable current sources for varying the output current, as well as providing additional current to circuitry within the driver (e.g., impedance circuitry). The programmable LVDS output driver may also include an impedance circuit for adjusting the output impedance of the output driver, while only diverting a small amount of source current. The current diverted by the impedance circuit may be compensated for by increasing the source current from the programmable current sources. The programmable LVDS output driver may also include pre-emphasis circuitry for boosting the edge rates of output signals.

12 Claims, 2 Drawing Sheets

PROGRAMMABLE LOW-VOLTAGE DIFFERENTIAL SIGNALING OUTPUT DRIVER

BACKGROUND OF THE INVENTION

The present invention relates to a low-voltage differential signaling (LVDS) output driver. More particularly, this invention relates to an LVDS output driver with a tri-statable output, programmable output current, programmable output resistance, and programmable pre-emphasis circuitry.

Low-voltage differential signaling (LVDS) is one of many I/O standards used in high-speed data transmission. A basic LVDS system includes an output driver and a receiver, connected by a pair of leads (e.g., copper traces, transmission lines, etc.) each having a fixed impedance (e.g., 50Ω). The output driver converts a differential logic signal into a low-level current, which, depending on the polarity of the signal, flows from one of two outputs towards the receiver. The current passes through a termination resistor at the receiver and flows back to the output driver. The receiver detects the direction of the current flow through the termination resistor to determine the polarity of the input differential signal and generates a corresponding full-scale logic signal.

LVDS offers several technological advantages over other standards, such as, for example, positive emitter controlled logic (PECL) and transistor—transistor logic (TTL). One advantage of LVDS is that an LVDS output driver may transmit signals at high speeds (e.g., over 1 Gbps) because the output current of the output driver does not spike at transitions of the input (e.g., from a high bit to a low bit, etc.).

Another advantage of LVDS is that the LVDS output driver generates a low current, which results in low power consumption by the output driver. This allows portable electronic devices (e.g., laptop computers) that use LVDS to consume less battery power. These and other advantages make LVDS an attractive choice for designers of high-speed systems.

However, despite the advantages of LVDS over other standards, current LVDS output drivers lack the flexibility to be programmed for or adapted to specific applications. For example, LVDS output drivers may only be coupled to receivers in a one-to-one configuration because their outputs are not tri-statable. Not only may a tri-statable output driver deactivate its output independent from the input, several tri-statable output drivers may be coupled to one or more receivers because when deactivated, a tri-statable output driver has an infinite output resistance. A tri-statable output driver may also include hot-socketing capabilities, which allows the output driver to be inserted or removed from a multi-driver system without interfering with signal transmission of another output driver.

Furthermore, the current sources of the LVDS output driver are not programmable. The output current of LVDS output drivers is typically fixed at 3 mA. However, certain LVDS applications prefer a lower or higher current. For example, the source current may be reduced to lower the power consumption of the output driver. Conversely, the source current may be increased to compensate for current diverted by additional circuitry in the output driver.

Furthermore, the output impedance of the LVDS output driver is not programmable. The characteristic output impedance of the LVDS output driver is high because of the theoretically infinite impedance of the current sources. If the output driver is coupled to the receiver as is, reflections and transmission loss will occur at high frequencies (because of the impedance mismatch between the output driver and the board traces). One known approach to matching the impedance of the output driver with that of the board trace is to use additional compensation circuitry (e.g., a parallel resistor at the output of the LVDS output driver). However, this approach may reduce the voltage drop across the termination resistor (i.e., by diverting current away from the termination resistor) while consuming the same amount of power.

Furthermore, LVDS signals typically have low edge rates and LVDS output drivers do not contain circuitry for adjusting the edge rates of the LVDS signals. Low edge rates may prevent the receiver from identifying bit transitions at high data transfer rates. For example, a bit transition from a low bit to a high bit may be incorrectly identified if the signal has not risen past the threshold for the receiver to identify the bit as a high bit.

SUMMARY OF THE INVENTION

A programmable LVDS output driver may be provided in accordance with the present invention. The programmable LVDS output driver may include circuitry for tri-stating the output of the output driver, which allows the output of the output driver to be disabled independent from the input. For example, two p-type transistors may be coupled to the current source, such that when ground is applied to the gates of the p-type transistors, the source current passes through one of the p-type transistors (depending on how the current is steered). When the source voltage is applied to gates of the p-type transistors, the output driver is prevented from passing current. When the output driver is disabled, the output impedance also becomes very high. This allows another output driver coupled to the receiver to transmit data to the receiver without being affected by the presence of the output driver.

The programmable LVDS output driver may also support hot socketing. Hot socketing allows the output driver to be tri-stated upon insertion even if the output driver has not yet been powered. This prevents the output driver from interfering with other signals being transmitted to the receiver at the time it is inserted.

The programmable LVDS output driver may also include programmable current sources. With fixed current sources, the output current is not adjustable. The source current may be adjusted to reduce the output current and power consumption of the output driver, or to compensate for current diverted to additional circuitry within the output driver, such as impedance circuitry.

The programmable LVDS output driver may also include impedance circuitry for adjusting the output impedance. To maximize high frequency performance, the output impedance of the output driver should be matched with that of the board traces coupled to the output driver. An impedance circuit may be coupled between the outputs of the output driver to not only adjust the impedance of the output driver, but also to limit the amount of current diverted from the output.

The impedance circuit may include two variable resistors that are coupled in series with two n-type transistors, such that the impedance of the circuit is equal to the total impedance of the variable resistors and transistors. The effective size of the transistors may be adjusted to vary both the amount of current flowing through the transistors and the impedances of the transistors. The source current from the programmable current sources may be increased to compensate for the small amount of current diverted from the output to the impedance circuitry. The circuit may also include a pull-up transistor, such that when the circuit is disabled, the pull-up transistor ensures that current does not flow through the circuit (i.e., the gate-to-source voltage of one of the series transistors may be forced negative by the drain of the pull-up transistor). When the impedance circuit is disabled, the output impedance of the output driver is infinite.

The programmable LVDS output driver may also include pre-emphasis circuitry. Pre-emphasis circuitry may boost the edge rate of the LVDS output. Typically, edge rates of LVDS outputs are slow, and at high frequencies, the receiver may incorrectly identify the current bit because the bit has not risen (or fallen) quickly enough to be identified. A pre-emphasis circuit may be coupled to each output of the output driver, such that when the pre-emphasis circuit detects a transition in the input, the pre-emphasis circuit produces a small burst of current. The superposition of the output current and the current produced by the pre-emphasis circuit results in a signal with a fast edge rate.

Further features of the invention, its nature and various advantages will be more apparent from the accompanying drawings and the following detailed description of the preferred embodiments.

DETAILED DESCRIPTION OF THE PREFERRED EMBODIMENTS

For purposes of illustration and not limitation, the present invention will be described in connection with a low-voltage differential signaling (LVDS) system. It should be noted that the principles of this invention may be applicable to other standards relating to the transmission of data.

Low-voltage differential signaling (LVDS) allows an output driver to transfer data to a receiver at high speeds, while only consuming a small amount of power. LVDS signaling may be accomplished by steering current from the output driver to the receiver in one of two opposing current paths. (Current flowing in one direction indicates a high bit is being transferred and current flowing in the opposite direction indicates a low bit is being transferred.) The current paths may be terminated by a termination resistor at the receiver. The receiver may detect the direction of the current flowing across the resistor (i.e., by measuring the voltage drop across the termination resistor) to determine the value of the bit being transferred.

Figure 1:
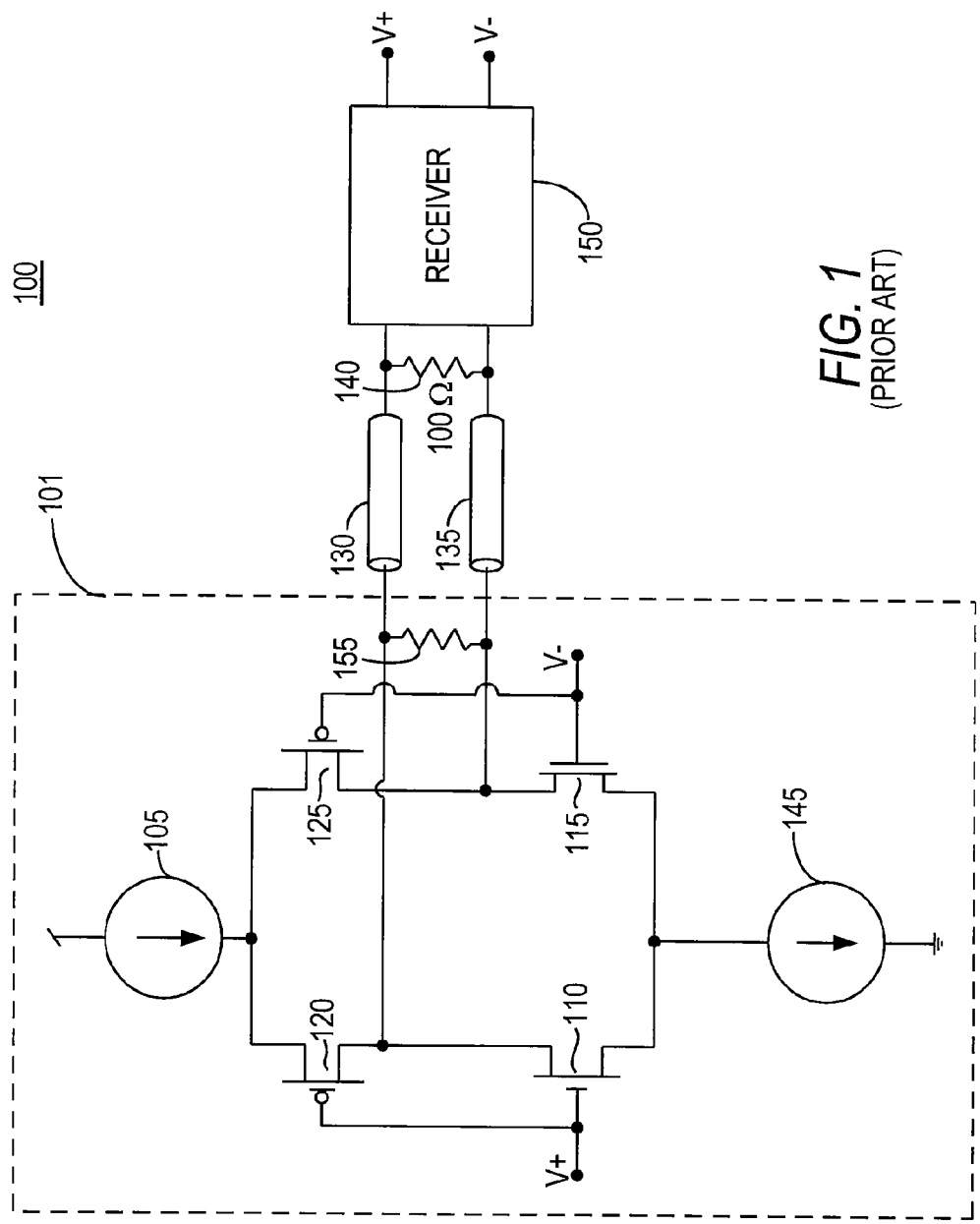
FIG. 1 is an illustrative circuit diagram of a prior art low-voltage differential signaling driver and receiver.

FIG. 1 is an illustrative circuit diagram of a prior art LVDS driver and receiver. As shown in FIG. 1, output driver 101 is coupled to receiver 150 via board traces 130 and 135, which are terminated with termination resistor 140.

Output driver 101 may include current sources 105 and 145 and steering transistors 110, 115, 120, and 125. Output driver 101 may receive a differential input. In general, differential signals are two-sided, in which one side of the differential signal carries a voltage higher than voltage of the other side of the differential signal. For example, one side of the differential signal may be at a voltage equal to the source voltage and the other side of the differential signal may be at a voltage equal and opposite to the source voltage. Whether the differential input represents a high or a low bit depends on the polarity of the differential signal (i.e., which side is high and which side is low). As shown in FIG. 1, the sides of the input differential signal are applied to the gates of transistors 110 and 120 and transistors 115 and 125, respectively.

A differential signal representing a high bit may be input into output driver 101 by applying, for example, the high side of the differential signal to the gates of transistors 110 and 120 and the low side of the differential signal to the gates of transistors 115 and 125. In this example, transistors 110 and 125 are biased to pass the source current in the linear region and transistors 115 and 120 are prevented from passing any current.

The arrangement of transistors in output driver 101 may only allow the source current to flow in one path. In this example, the source current may first pass through transistor 125 (which has been turned on by the negative side of the differential signal) and out of the driver. Next, the current flows through board trace 135, across termination resistor 140, and through board trace 130 back into the driver. Finally, the current travels through transistor 110 (which has been turned on by the positive side of the differential signal) and into current source 145 (which draws the same amount of current as current source 105). In some embodiments, current source 145 may be mirrored from current source 105 to prevent current leakage from excess current.

When the differential input switches from representing a high bit to a low bit, the current may flow in an opposite direction than when the differential input represented a high bit. For example, the negative side of the differential signal may be applied to the gates of transistors 110 and 125 and the positive side of the differential signal may be applied to the gates of transistors 115 and 125. In this example, transistors 115 and 120 are biased to pass current, while transistors 110 and 125 are prevented from passing current. The current may travel in a path through transistor 120, board trace 130, termination resistor 140, board trace 135, transistor 115, and finally current source 145.

As shown in the two examples above, the output current may travel across termination resistor 140 in opposite directions depending on the polarity of the differential signal. A differential signal of one polarity will induce a voltage drop across termination resistor 140 in one direction and a differential signal of the opposite priority will cause a voltage drop across termination resistor 140 in the opposite direction. This allows receiver 150, which detects the voltages on either side of termination resistor 140, to determine whether the bit being transmitted by output driver 101 is a high or low bit. Receiver 150 may generate a full-scale logic signal in response to detecting the direction of the voltage drop across termination resistor 140.

In some embodiments, output driver 101 may include matching resistor 155 for matching the output impedance of output driver 101 with that of board traces 130 and 135. Although this approach allows for higher data transfer rates, as much as two-thirds of the output current may be diverted through matching resistor 155, thus significantly reducing the voltage drop across termination resistor 140.

Figure 2:
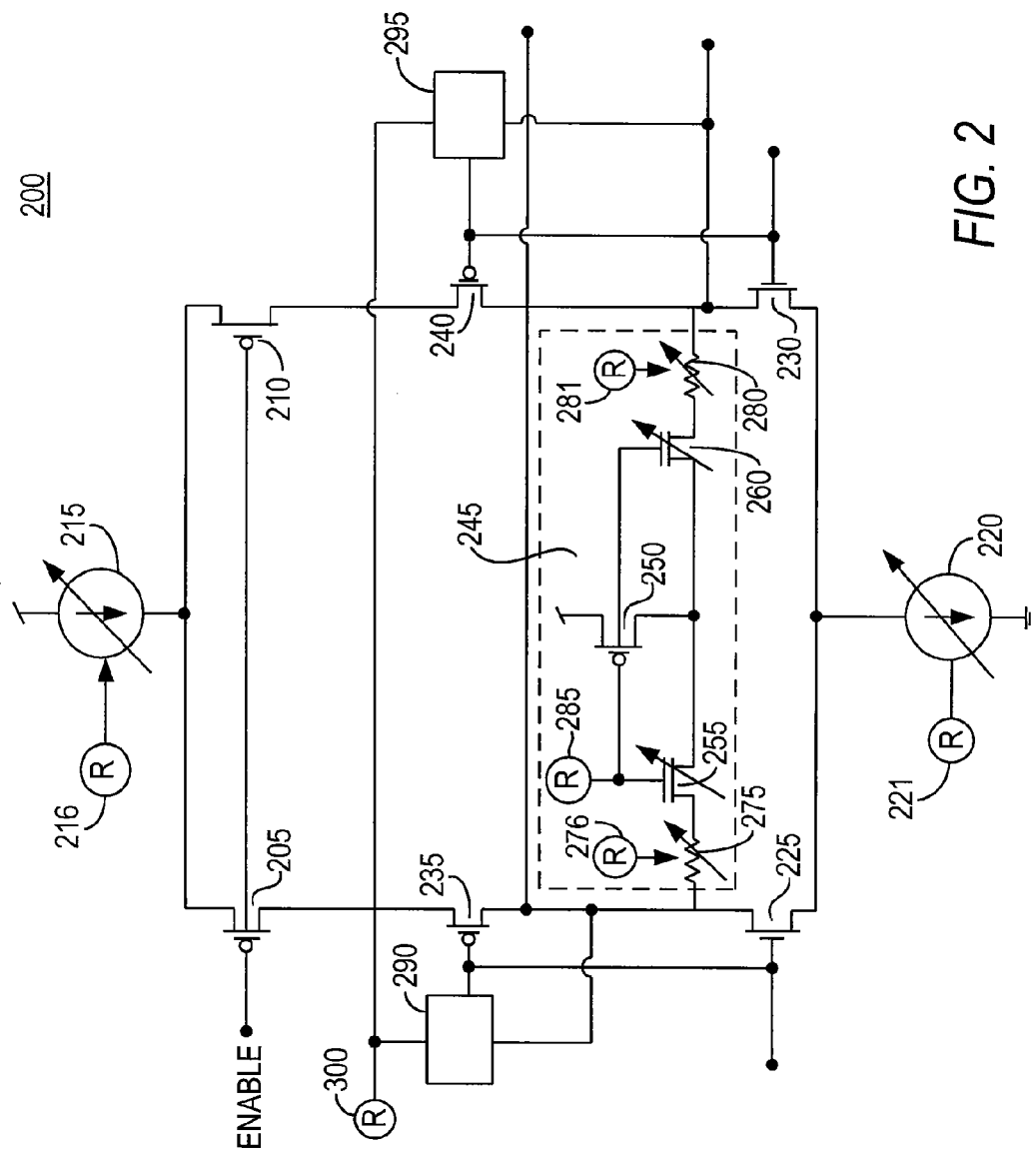
FIG. 2 is an illustrative circuit diagram of a programmable low-voltage differential signaling driver in accordance with the present invention.

A programmable LVDS output driver 200 is shown in FIG. 2. Output driver 200 includes the basic components of output driver 101 (FIG. 1), including current sources 215 and 220 and current steering transistors 225, 230, 235, and 240. As such, output driver 200 operates similarly to output driver 101. For example, if the high side of a differential input is applied to the gates of transistors 225 and 235 and the low side of the differential input is applied to the gates of transistors 230 and 240, current flows through transistor 240, across the termination resistor (not shown) and through transistor 225. A differential signal of the opposite polarity results in current flowing through transistor 235, through the termination resistor (not shown) in the opposite direction, and through transistor 230.

However, as shown in FIG. 2, output driver 200 includes additional circuitry, such as tri-state transistors 205 and 210, programmable current sources 215 and 220, impedance circuitry 245, and pre-emphasis circuits 290 and 295, each of which contributes to the programmability of output driver 200.

One feature of output driver 200 that is not available in output driver 101 (FIG. 1) is the ability to tri-state the output. A tri-statable output driver may disable its output independent from the input. When the output is disabled, the output resistance of the output driver is infinite to allow several such output drivers to be coupled to a single receiver (i.e., such that the presence of the other output drivers does not affect the signal from the output driver that is talking to the receiver).

The ability to tri-state the output of output driver 200 is provided by transistors 205 and 210. In normal operation, a low enable bit may applied to the gates of transistors 205 and 210 to allow current to pass through transistors 205 and 210. When enable bit is held high, current is prevented from passing through transistors 205 and 210. In effect, this approach deactivates current sources 215 and 220.

When the output current is turned off, the output impedance of output driver 200 is infinite and the presence of output driver 200 does not affect current flowing from the other output drivers, if any, also coupled to the receiver.

In some embodiments, transistors 205 and 210 may be implemented with a single p-type transistor coupled to the output of current source 215.

Output driver 200 may also support hot socketing. Hot socketing allows output driver 200 to be tri-stated upon insertion even if output driver 200 is not yet powered (e.g., during the power-up sequence). Typically, if output driver 200 is not powered, the enable bit is low and the impedances of transistors 205 and 210 are low, thus allowing current from another output driver to be diverted into output driver 200. Hot socketing prevents output driver 200 from interfering with signals being transmitted to the receiver (i.e., the output impedance of output driver 200 is high even if it is initially unpowered).

The enable bit for each tri-state transistor may be driven by hot socketing circuitry (not shown), which if not powered, stores a voltage that is at least as large as the voltage of the corresponding output. Therefore, current is prevented from entering output driver 200 from another output driver because the gate-to-source voltage of the tri-state transistor is zero. This prevents current from being diverted away from the receiver. Additional discussion of hot socketing may be found in Mejia U.S. Pat. No. 6,040,712, filed May 24, 1999, which is hereby incorporated by reference herein in its entirety.

Another feature of output driver 200 is the ability to program the output current. As shown in FIG. 2, current sources 215 and 220 are programmable. Current sources 215 and 220 may be controlled by, for example, instructions stored in user-configurable random access memory (RAM) 216 and 221, respectively. In some embodiments, a single user-configurable RAM may be used to control both current sources 215 and 220. For example, the output current may be decreased from the default LVDS output current of 3 mA to reduce the power consumed by output driver 200. The output current of current sources 215 and 220 may also be increased in connection with adjusting the output resistance, which is discussed in greater detail below. Therefore, depending on the application, it may be beneficial for programmable current sources 215 and 220 to produce a smaller or larger current than the default source current.

In order to maximize high frequency performance, the output impedance of LVDS output drivers must be matched with the impedance of the board traces. For example, a pair of 50Ω traces may be coupled to the outputs of an LVDS output driver. To prevent reflections, the output impedance of the LVDS output driver should be set to 100Ω (i.e., 2×50Ω=100Ω). However, the output impedance of the LVDS driver is theoretically infinite because the current from each output originates from a current source, which has infinite impedance. An external resistor (e.g., a 100Ω resistor) may be coupled in parallel with the outputs of the driver to match the output impedance of the driver with that of the board trace. This approach, however, reduces the voltage drop across the resistor while consuming the same amount of power.

The output impedance of an LVDS output driver may be adjusted without diverting current away from the termination resistor, as shown in output driver 200 in FIG. 2. Output driver 200 utilizes impedance circuitry 245 for adjusting the output impedance. Circuitry 245 is coupled in parallel to the output of driver 200. Therefore, because the impedances of current sources 215 and 220 are theoretically infinite, the impedance of output driver 200 is equal to the impedance of circuitry 245.

Impedance circuitry 245 may include, for example, pull-up transistor 250, current-limiting transistors 255 and 260, variable resistors 275 and 280, and configurable RAM 285. Configurable RAM 285 may be coupled to the gates of transistors 250, 255, and 260 to control whether (and how much) current flows through circuitry 245. Transistors 255 and 260 may be implemented as a parallel array of unit transistors each having a small width-to-length ratio. A gate voltage may be selectively applied by RAM 285 to each unit transistor to control the overall current flowing from the array.

For example, RAM 285 may apply a ground signal to the gates of transistors 250, 255, and 260 to disable circuitry 245, which prevents current from flowing through circuitry 245. Because both transistors 255 and 260 are prevented from passing current, their drain-to-source resistances are infinite. Therefore, when ground is applied to the gates of transistors 250, 255, and 260, the output resistance of output driver 200 is infinite.

In some instances, the voltage of one of the outputs of output driver 200 may briefly become negative, but as long as ground is applied to the gates of transistors 250, 255, and 260, current is prevented from flowing through circuitry 245. For example, the voltage on the drain of transistor 225 may be negative. This may induce a negative voltage on the source of transistor 255, which creates a positive gate-to-source voltage and enables transistor 255 to pass current. However, the voltage on the drain of pull-up transistor 250 is drawn close to the source voltage because the current from transistor 250 has no path to flow. This forces a positive voltage on the source of transistor 260 (i.e., the source of transistor 260 is coupled to the drain of transistor 250). As such, current is prevented from flowing through transistor 260 because the gate-to-source voltage is negative. Because transistors 255 and 260 are connected in series, current is prevented from flowing through circuitry 245.

In another example, RAM 285 may apply the source voltage to the gates of transistors 250, 255, and 260 to induce circuit 245 to pass a current. The resistance of circuit 245 is equal to the combined resistances of variable resistors 275 and 280 and transistors 255 and 260.

The resistance of each of transistors 255 and 260 is equal to the ratio of the drain-to-source voltage to the current. The drain-to-source voltage of each transistor is small because circuit 245 is coupled between the low-voltage outputs of output driver 200. The current flowing through each transistor may be adjusted to control the resistance of the transistor (by varying the effective width-to-length ratio). In some embodiments, the current of each transistor may be increased to minimize the resistance of each transistor. In some embodiments, the current of each transistor may be minimized to prevent excess current from being diverted away from the output of output driver 200. In some embodiments, a balancing approach may be taken such that the current of each transistor is not excessively high in relation to the source current and the resistance is not excessively large in relation to the resistance of the board traces.

The impedance of circuitry 245 may be matched to the impedance of the board traces (FIG. 1) for maximum high speed performance. As stated above, the resistances of transistors 255 and 260 may be adjusted by varying the effective width-to-length ratios of transistors 255 and 260 using, for example, user-configurable RAM 285. The resistances of variable resistors 275 and 280 may be adjusted using user-configurable RAM 276 and 281, respectively. For example, if the characteristic impedance of each trace is 50Ω, the combined total impedance of circuitry 245 should be set to 100Ω.

However, impedance matching circuit 245 diverts current away from the output of driver 200, which flows through the termination resistor (FIG. 1). If the diverted current is not compensated for, then output driver 200 would suffer from similar drawbacks as output driver 101 (FIG. 1) (i.e., current is diverted away from the output, resulting in a smaller voltage drop across the termination resistor at the receiver).

Output driver 200 may compensate for the current diverted through circuitry 245 by increasing the current provided by programmable current sources 215 and 220 to compensate for the small amount of current diverted through circuitry 245. In some embodiments, a current sensor at the output of output driver 200 may be coupled in a negative feedback loop with RAM 216 and 221 to gradually increase the source current until the output current is at the desired level.

Therefore, in order to adjust the output impedance of output driver 200 without affecting the amount of output current flowing across the termination resistor, the source current from programmable current sources 215 and 220 may be increased to compensate for the current diverted through circuitry 245.

In addition to output impedance adjusting circuitry, LVDS output driver 200 may also include pre-emphasis circuitry for boosting the edge rates of the output signals. Typically, edge rates of LVDS signals are slow, and at high frequencies, the receiver may incorrectly identify the current bit because the bit has not risen (or fallen) quickly enough to be identified. Pre-emphasis circuits are discussed in greater detail in Baig et al. U.S. patent application Ser. No. 10/702,195, filed Nov. 4, 2003 and Kwasniewski et al, U.S. patent application Ser. No. 10/756,949, filed Jan. 13, 2004 which are herein incorporated by reference in their entireties.

Pre-emphasis circuits 290 and 295 may be controlled by configurable RAM 300, which may deactivate or vary the response of circuits 290 and 295. Pre-emphasis circuits 290 and 295 may each receive one side of the differential signal as an input to detect bit transitions. For example, circuit 290 may detect a bit transition when one side of the differential signal swings from a negative voltage to a positive voltage. In order to increase the edge rate of the bit transition, circuit 290 may produce a burst of current, such that the superposition of the current from circuit 290 and the output current results in a signal with a fast rising edge. Preferably, the superimposed burst does not create a spike in the common mode voltage. Because the differential inputs switch in unison, circuit 295 may also draw a burst of current, resulting in a signal with a fast falling edge to match the fast rising edge of the other side of the differential input, (i.e., to create an instantaneous voltage drop across the termination resistor).

The foregoing is only illustrative of the principles of this invention and various modifications can be made by those skilled in the art without departing from the scope and spirit of the invention. For example, user-configurable RAM has been discussed as an illustrative mechanism for controlling programmable components. However, there are several suitable alternatives for using user-configurable RAM, including, for example, fuses, antifuses, EPROM, EEPROM, pass transistors, transmission gates, laser fuses, metal-optional links, programmable logic, reprogrammable logic, field programmable logic, factory programmable logic, and any other suitable mechanisms for controlling adjustable or programmable components.

What is claimed is:

1. A low-voltage differential signaling (LVDS) output driver comprising:
   first and second input terminals for receiving a differential input signal;
   first and second output terminals for outputting a differential output signal;
   a programmable current source for providing a source current;
   a plurality of transistors for steering a majority of the source current as an output current out of one of the first and second output terminals; and
   impedance circuitry coupled between the first and second output terminals, wherein:
   the impedance of the impedance circuitry is programmable; and
   the current flowing through the impedance circuitry is programmable; said LVDS output driver further comprising:
   circuitry for tri-stating the differential output signal, said circuitry for tri-stating comprising a switch coupled to the programmable current source, wherein the switch is open to allow the source current to flow and closed to block the source current from flowing.

2. The LVDS output driver of claim 1, further comprising a pre-emphasis circuit coupled to each of the first and second output terminals, wherein each pre-emphasis circuit receives one end of the differential input signal and boosts the edge rate of the differential output signal by producing a burst of current at transitions of the differential input signal.

3. The LVDS output driver of claim 1, wherein the impedance circuitry further comprises a variable resistor.

4. The LVDS output driver of claim 1, wherein the impedance circuitry further comprises transistors for limiting the amount of current flowing through the impedance circuitry.

5. The LVDS output driver of claim 4, wherein the transistors are implemented as a parallel array of unit transistors each having small width-to-length ratio, and wherein each unit transistor is selectively activated to control the overall current flowing from the array.

6. The LVDS output driver of claim 1, wherein the source current is increased to compensate for the current diverted away from the output current and into the impedance circuitry.

7. A low-voltage differential signaling (LVDS) output driver comprising:
- first and second output terminal means for outputting a differential output signal;
- means for producing a source current;
- means for steering a majority of the source current as an output current out of one of first and second output terminal means;
- means for adjusting the impedance of the output driver, wherein a current is diverted from the output current to allow the impedance of the driver to be adjusted;
- means for adjusting the amount of current diverted from the output current for adjusting the impedance of the driver; and
- means, between the means for producing and the means for steering, for tri-stating the differential output signal.

8. The LVDS output driver of claim 7, further comprising means coupled to the first and second output terminal means for boosting the edge rate of the current of each output terminal means.

9. The LVDS output driver of claim 7, wherein the means for adjusting the amount of current diverted from the output current comprises a transistor coupled between the first and second output terminal means of the driver.

10. The LVDS output driver of claim 9, wherein the transistor is implemented as a parallel array of unit transistors each having small width-to-length ratio, and wherein each unit transistor may be selectively activated to control the overall current flowing from the array.

11. The LVDS output driver of claim 9, wherein the means for adjusting the impedance of the driver comprises a variable resistor coupled in series with the transistor.

12. The LVDS output driver of claim 7, wherein the source current is increased to compensate for the current diverted from the output current for adjusting the impedance of the driver.

* * * * *